United States Patent [19]
Wolfram et al.

[11] Patent Number: 4,901,330
[45] Date of Patent: Feb. 13, 1990

[54] OPTICALLY PUMPED LASER

[75] Inventors: Thomas Wolfram, Wheaton; Bruce A. Vojak, Naperville; Edward T. Maas, Jr., Batavia; Robert D. Burnham, Wheaton, all of Ill.

[73] Assignee: Amoco Corporation, Chicago, Ill.

[21] Appl. No.: 221,670

[22] Filed: Jul. 20, 1988

[51] Int. Cl.$^4$ .............................................. H01S 3/091
[52] U.S. Cl. ........................................ 372/75; 372/46; 372/50; 372/71
[58] Field of Search ....................... 372/43, 45, 46, 50, 372/69, 70, 71, 75

[56] References Cited
U.S. PATENT DOCUMENTS

4,751,711 6/1988 Welch et al. ........................... 372/46
4,791,631 12/1988 Baumert et al. ....................... 372/75

Primary Examiner—William L. Sikes
Assistant Examiner—B. R. R. Holloway
Attorney, Agent, or Firm—Gary C. Cunningham; William H. Magidson; Ralph C. Medhurst

[57] ABSTRACT

An optically pumped laser which includes a laser diode array for generating optically pumped radiation having a uniform intensity distributed over a broad band-width, and a lasant material with an absorption band for receiving radiation within such bandwidth.

27 Claims, 6 Drawing Sheets

OPTICALLY PUMPED LASER

BACKGROUND OF THE INVENTION

1. Field of the invention

This invention relates to an improved optically pumped laser. In particular, the optically pumped laser includes a laser diode array for generating optically pumped radiation having a uniform intensity distributed over a broad bandwidth and a lasant material with an absorption band for absorbing radiation within the above bandwidth.

2. Description of the Prior Art

A laser is a device which has the ability to produce monochromatic, coherent light through the stimulated emission of photons from atoms or molecules of an active medium or lasant material which have typically been excited from ground state to a higher energy level by an input of energy. Such a device contains an optical cavity or resonator which is defined by highly reflective surfaces which form a closed round trip path for light, and the active medium is contained within the optical cavity.

If a population inversion is created by excitation of the lasant material, the spontaneous emission of a photon from an excited atom or molecule returning to its ground state can stimulate the emission of photons of identical energy from other excited atoms or molecules. As a consequence, the initial photon creates a cascade of photons between the mirrors of the optical cavity which are of identical energy and exactly in phase. A portion of this cascade of photons is then discharged out of the optical cavity, for example, by transmission through one or more of the reflecting surfaces of the cavity.

Excitation of the lasant material of a laser can be accomplished by a variety of methods, such as, by optical pumping, current injection or the use of an electrical discharge. Optical pumping involves the creation of a population inversion through the absorption of light by a lasant material. The use of light from noble gas arc lamps, tungsten-halogen lamps, light-emitting diodes, laser diodes and laser diode arrays to optically pump or excite the lasant material of a laser is well known.

In order to effect optical pumping, the photons delivered to the lasant material from a radiant source must be of a very precise character as within the absorption band of the lasant material. In particular, the pumping radiation must be of a wavelength which is absorbed by the lasant material to produce the required population inversion.

U.S. Pat. No. 3,624,545 issued to Ross describes an optically pumped solid state laser composed of a neodymium-doped yttrium aluminum garnet (Nd:YAG) rod which is side-pumped by at least one semiconductor laser diode. Similarly, U.S. Pat. No. 3,753,145 issued to Chesler, discloses the use of one or more light-emitting semiconductor diodes to end pump a Nd:YAG rod. The use of an array of pulsed laser diodes to end pump a solid lasant material such as neodymium-doped YAG is described in U.S. Pat. No. 3,982,201 issued to Rosenkrantz et al.

Lasers, such as semiconductor diode lasers, are activated by the application of an electrical current. Laser diodes are efficient pumps for optically pumped lasers since the output radiation from the laser pump is a single wavelength (or a very narrow band of wavelengths) which is selected in such a manner that matches the absorption band or peak of the lasant material to be optically pumped. Unfortunately, it is frequently difficult to match the output radiation of the laser pump with the appropriate absorption band of the lasant material, since the output radiation from the laser pump source is generally of a single wavelength which is selected in such a manner so as to precisely match the absorption band peak of the lasant material which is to be optically pumped. Moreover, temperature, pressure and aging of diode lasers significantly affect, alter and change the characteristics of laser diodes, by changing the wavelength of the output radiation of laser diode pumps. Thermoelectric heaters/coolers and sophisticated feedback circuits are utilized with a goal toward precisely matching the output radiation of laser diodes with the absorption band or peak of the lasant material. Over the years a number of laser diodes have been suggested for matching the output radiation of laser pumps with the absorption band of the lasant material, however, such laser diodes have resulted in varying degrees of success. It is therefore desirable to provide an improved optically pumped laser which overcomes most, if not all, of the above problems.

R. B. Allen, GaAlAs Diode Pumped Nd:YAG Laser, Technical Report AFAL-TR-72-319, Jan. 1973, pp. 1-9, describes the results of a program to develop and test a laboratory model of a room-temperature GaAlAs diode-pumped Nd:YAG. The Report discloses a laser which produced a CW power of more than 80 mW in the TEMoo mode, which it was asserted, represented the highest level of TEMoo power reported to date for a diode-pumped laser. The GaAlAs light emitting diodes in this Report were selected for the best room temperature spectral match to the Nd:YAG absorption band near 805 nm. The CW operating characteristics of the 15 best of 17 individually fabricated subarrays are given in Table 1 (of the Allen report), which includes the peak emission wavelength at 25° C. for 250 mA drive current. The distribution of the subarray is found in FIG. 4 (of the Allen report), which is a graph of the output power versus the peak emission wavelength. Twelve of the subarrays have peak emission wavelengths in the range of 805 nm plus or minus 5 nm. The other three have shorter wavelengths. The CW operating characteristics of the 2 worst of the 17 individually fabricated subarrays were ignored.

U.S. Pat. No. 3,946,331 issued to Pollack et al. describes a Nernst lamp for optical pumping of a solid state laser. The lamp materials were selected so that the light emitted was essentially concentrated in the relatively narrow pump region of the absorption spectrum of the laser crystal.

W. T. Tsang, Appl. Phys. Letter, Vol. 36, No. 6, 1980, pp. 441-443 discloses a multiwavelength transverse-junction-stripe laser, which is capable of emitting multiple predominantly single-longitudinal mode emissions at various wavelengths. In an example, four different outputs at 902.5, 879.3, 853.2 and 827.6 nm were obtained simultaneously from a single-wavelength TJS laser.

In contrast, none of the above references disclose or suggest an optically pumped laser comprising a laser diode array for generating optical pumping radiation, such pumping radiation having a bandwidth which is about 3 nm to about 15 nm wide and wherein the intensity of the pumping radiation is substantially uniformly distributed over such bandwidth, and a lasant material with an absorption band for receiving radiation within the bandwidth of the laser diode array.

SUMMARY OF THE INVENTION

The instant invention discloses an optically pumped laser which includes a laser diode array for generating optical pumping radiation having a uniform intensity distributed over a broad bandwidth, and a lasant material with an absorption band for receiving radiation within such bandwidth.

An embodiment of the invention includes an optically pumped laser comprising: (a) a laser diode array for generating optical pumping radiation, said pumping radiation having a bandwidth which is about 3 nm to about 15 nm wide and wherein the intensity of the pumping radiation is substantially uniformly distributed over said bandwith, and (b) a lasant material with an absorption band for receiving radiation within said bandwidth of said laser diode array.

An object of the invention is to provide an optically pumped laser which includes a laser diode array that emits optical pumping radiation having a uniform intensity over a broad bandwidth for providing stable pumping radiation to a lasant material, thereby providing an improved and more stable optically pumped laser which provides enhanced stability despite aging and temperature, pressure, and current variations.

Another object of the invention is to provide an optically pumped laser that eases and relaxes the requirements of wavelength matching by providing a broad bandwidth output radiation from the laser to the absorption band of the lasant material.

BRIEF DESCRIPTION OF THE DRAWINGS

FIG. 6a of the drawings is a perspective view partially cut away of yet another laser diode array suitable for use in the practice of this invention.

FIG. 6b of the drawings is a graph of the temperature versus position of the laser diode array, as set forth in FIG. 6a.

DETAILED DESCRIPTION OF THE PREFERRED EMBODIMENTS

While this invention is susceptible of embodiments in many forms, there are shown in FIGS. 1-11 several specific embodiments suitable for use in the practice of this invention, with the understanding that the present disclosure is not intended to limit the invention to the embodiments illustrated.

Figures 1, 2A, 2B:
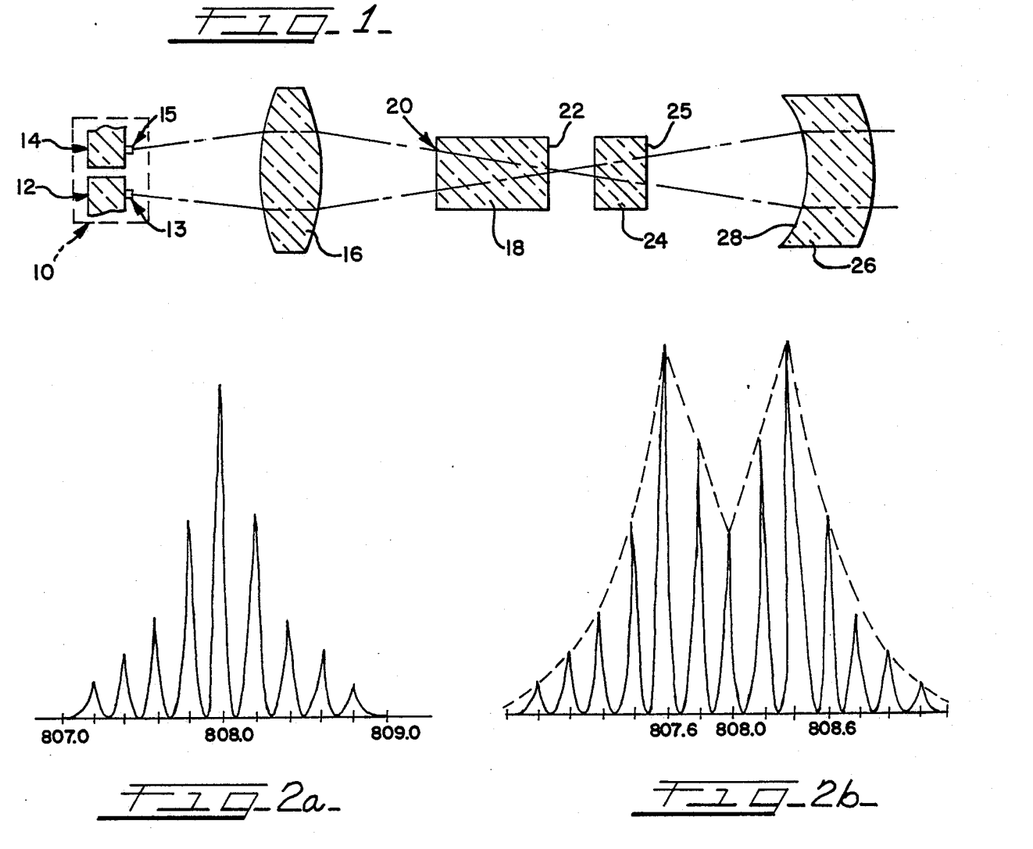
FIG. 1 of the drawings is a schematic view representative of an embodiment of this invention.
FIG. 2a is a graph of the emission spectrum of a conventional diode laser.
FIG. 2b is a graph of the emission spectrum of a first diode array comprised of two strips suitable for use in the practice of this invention.

Referring to FIG. 1, an optical pumping means or laser diode array 10 is shown. Laser diode array 10 consists of elements or heat sinks 12 and 14 with laser diodes or strips 13 and 15, respectively, attached thereto. Light from laser diodes 13 and 15, is guided by lens 16 into lasant material 18.

Such devices are commonly attached to a heat sink, and packaged in a metal housing. A highly suitable optical laser diode array 10 consists of gallium aluminum arsenide laser diodes. The diode output radiation of 13 and 15 should substantially match the absorption band of lasant material 18. If lasant materials other than Nd:YAG are used, then appropriate semiconductor materials must be chosen to meet the above wavelength criteria.

In the laser diode array of FIG. 1, diode 13 emits light at a wavelength of about 2 nm or less below the absorption peak of the lasant material 18 and laser diode 15 emits light at a wavelength of about 2 nm or less above the absorption peak at the lasant material 18. Laser diodes 13 and 15 can be tuned for the appropriate output radiation wavelength, by thermoelectric heaters/coolers, varying the aluminum and/or doping concentration in laser diodes 13 and 15. Referring to FIG. 2b, assuming the absorption peak of the lasant material 18 is at about 808 nm, laser diode 13 emits light at a wavelength ranging from about 806 nm to about 808 nm, preferably about 807.6 nm, and laser diode 15 emits light at a wavelength ranging from about 808 nm to about 810 nm, preferably about 808.4 nm, under lasing conditions. As is known to those skilled in the art, the absorption peak of the lasant material can vary from sample to sample. Accordingly, the above wavelength values are merely exemplary.

In FIG. 1, the optical pumping means or laser diode array 10 with laser diodes 13 and 15, generates an optical pumping radiation having a bandwidth which is about 3 nm wide and wherein the intensity of the pumping radiation is substantially uniformly distributed over such bandwidth (see phantom (dashed) waveform in FIG. 2b). The waveform in FIG. 2b represents a situation where the longitudinal waveforms exactly overlap. Even if such waveform does not exactly overlap, a uniform intensity distributed over a broad bandwidth is obtained. The lasant material 18 with a fixed absorption band receives radiation within the above bandwidth from the laser diode array 10, as is shown in FIG. 1.

Heat sinks 12 and 14 can be passive in character. Heat sinks 12 and 14 can also include a thermoelectric cooler to help maintain laser diodes 13 and 15 at a constant temperature and thereby ensure optimal operation of laser diodes 13 and 15. During operation the laser diode array 10 will be attached to a suitable power supply. Electrical leads from laser diodes 13 and 15 which are connected to a power supply are not illustrated in FIG. 1.

Lasant material 18 has a suitable reflective coating on input surface 20 and is capable of being pumped by the light from laser diode array 10. The lasant material 18 also has an output surface 22. The reflective coating on input surface 20 is highly transparent with respect to light produced by the laser diode array 10 but is highly reflective with respect to light produced by the lasing of lasant material 18.

Light emitted by the lasing of lasant material 18 is passed through a nonlinear optical material 24 to output coupler 26 which has a suitable reflective coating on surface 28 which is highly reflective with respect to light emitted by lasant material 18 but substantially transparent to frequency-modified light produced by nonlinear optical material 24. Nonlinear optical material 24 has an output surface 25. Output coupler 26 is configured in such a manner so that it serves to collimate the output radiation from the laser which passes through it. It should be understood, however, that nonlinear optical material for 24 is not required for the practice of this invention, and merely represents a preferred embodiment of this invention.

Laser diode array 10 has an emission spectrum or bandwith which is wider than or envelopes the absorption band of lasant material 18 which is being pumped. The matching of laser light output from laser diode array 10 to lasant material 18 is less sensitive to temperature and current variations, and aging of laser diodes 13 and 15, than typical diode pumped lasers because of the wide bandwidth of diode laser array 10 as illustrated in FIG. 2b. In FIG. 1, only two laser diodes 13 and 15 are shown. However, more than two laser diodes may be utilized. The bandwidth of laser diode array 10 in FIG. 2b is at least about twice as wide as a conventional laser diode, as illustrated in FIG. 2a. Moreover, the laser diode array 10 does not require as sophisticated and sensitive feedback and thermoelectric heater/cooler circuitry to match the absorption band of the lasant material 18, because the bandwidth of laser diode array 10 is wider than conventional narrow bandwidth laser diodes. Further, laser diode array 10 eases and relaxes the wavelength matching of array 10 to lasant material 18 by providing a broad bandwidth output radiation from array 10 to the absorption band of the lasant material 18, resulting in enhanced stability despite aging and temperature, pressure and current variations.

A stable and steady optically pumped laser such as the instant invention has a multitude of uses and is highly suitable for situations where environmental variations exist, such as but not limited to, metrology, laser printers, bar code readers, optical storage, medical applications, laser radars, etc. It is particularly advantageous in situations where severe environmental variations exist, such as but not limited to aerospace, automotive applications, industrial sensing, communications, gun sights, target designators and many military applications, etc.

It should be noted that an excessively broad emission spectrum or bandwidth should not be sought since an excessively broad bandwidth would sacrifice pumping efficiency and output power. Accordingly, the laser diode array 10 overcomes the problems associated with narrow bandwidth laser diodes or arrays by sacrificing some power output to attain a steady and stable power output.

Lens 16 serves to focus light from laser diodes 13 and 15 onto lasant material 18. This focusing results in a high pumping intensity and an associated high photon to photon conversion efficiency in lasant material 18. Any conventional optical means for focusing light can be used in place of lens 16. For example, a gradient index lens, a ball lens, an aspheric lens or a combination of lenses can be utilized. Lens 16 is not essential to the operation of this invention, and the use of such focusing means merely represents a preferred embodiment.

Any conventional lasant material 18 can be utilized in the present invention, provided that it is capable of being optically pumped by the laser diode array 10 selected. Suitable lasant materials include, for example, materials consisting of neodymium-doped yttrium vanadate ($Nd:YVO_4$); neodymium and/or cromium-doped gadolinium scandium gallium garnet (Nd, Cr:GSGG); thallium, holmium and/or erbium-doped yttrium aluminum garnet (Tm, Ho, Er:YAG); titanium sapphire (Ti:$Al_2O_3$); glassy and crystalline host materials which are doped with an active material. Highly suitable active materials include, ions of chromium, titanium and the rare earth metals. A neodymium-doped YAG is a highly suitable lasant material 18 for use in combination with laser diode array 10 producing light having a wavelength of about 808 nm. When pumped with light of this wavelength, the neodymium-doped YAG or lasant material 18 can emit light having a wavelength of 1,064 nm.

The geometric shape of lasant material 18 can vary widely. For example, the lasant material can have lens-shaped surfaces or be rhombohedral in shape if desired. Although not illustrated in the drawings, an embodiment can include the use of a fiber of lasant material which is end-pumped by the optical pumping means 10. Highly suitable fibers for this purpose include, for example, glass optical fibers which are doped with ions of a rare earth metal such as neodymium. If a very long fiber is required, it can be coiled, on a spool for example, in order to minimize the overall length of the laser of the instant invention.

Lasant material 18 has a reflective coating on surface 20. This coating is conventional in character and is selected so as to transmit as much incident pumping radiation from laser diodes 13 and 15 as possible, while being highly reflective with respect to the radiation or light produced by the lasing of lasant material 18.

For a neodymium-doped YAG rod 18 which is pumped with light having a wavelength of 808 nm, the coating on input surface 20 should be substantially transparent to 808 nm light and highly reflective with respect to light having a wavelength of 1,064 nm. In a preferred embodiment, this coating will also be highly reflective of light having a wavelength of 532 nm, the second harmonic of the aforementioned 1,064 nm light. The wavelength selective mirror which is created by the coating on input surface 20 need not be located on the input surface 20 of lasant material 18. If desired, this mirror can be located anywhere between laser diode array 10 and the lasant material 18, and can consist of a coating deposited on any suitable substrate. In addition, the mirror can be of any suitable shape.

Light emitted by the lasing of lasant material 18 is passed through nonlinear optical material 24. By proper orientation of the crystal structure of the non-linear optical material 24 with respect to the incident light produced by lasant material 18, the frequency of the incident light can be modified, for example, doubled or tripled, by passage through nonlinear optical material 24. For example, light having a wavelength of 1,064 nm from a neodymium-doped YAG lasant material 18 can be converted to light having a wavelength of 532 nm upon passage through nonlinear optical material 24. The geometric shape of nonlinear optical material 24 can vary widely. For example, the nonlinear optical material can have lens-shaped surfaces or be rhombohedral in shape if desired. Further, any such nonlinear optical component can comprise heating or cooling means to control the temperature of the nonlinear optical material 24 and thereby optimize its performance as a harmonic generator. Nonlinear optical material has an output surface 25.

Potassium titanyl phosphate is a preferred nonlinear optical material 24. However, any of the many known nonlinear optical materials can be utilized in the practice of this invention. Such known nonlinear optical materials can be a solid or a liquid, and can include, for example $KH_2PO_4$, $LiNbO_3$, $KNbO_3$, $LiIO_3$, $HIO_3$, $KB_5O_8 \cdot 4H_2O$, urea and compounds of the formula $MTiO(X04)$ where M is selected from the group consisting of K, Rb and Tl, and X s selected from the group consisting of P and As. The non-linear optical material 24 is not an essential component and its use represents one embodiment of this invention.

As a consequence of the fact that nonlinear optical material 24 is not 100 percent efficient as a second harmonic generator, light passing through this component from lasant material 18 will ordinarily consist of a mixture of frequency doubled or summed light and unmodified light. In the case of light having a wavelength of 1,064 nm from neodymium-doped YAG as the lasant material 18, the light passed through nonlinear optical material 24 will be a mixture of 1,064 nm and 532 nm wavelengths. This mixture of wavelengths is directed to output coupler 26 which has a reflective coating on surface 28 which is wavelength selective. This coating is conventional in character and is selected in such a manner that it is substantially transparent to the 532 nm light but highly reflective with respect to the 1,064 nm light. Accordingly, essentially only frequency doubled light having a wavelength of 532 nm is emitted through the output coupler 26.

The output coupler 26 includes a wavelength selective mirror which is created by the coating on surface 28. It need not be of the precise design illustrated in FIG. 1, and can be of any conventional form. For example, the wavelength selective mirror can be created by a coating on surface 25 of nonlinear optical material 24. In this event, output coupler 26 could be either eliminated or replaced by optical means whose sole purpose is to collimate or otherwise modify the output radiation or laser light from the lasant material 20. However, the concave shape of the mirror created by the coating on surface 28 has the advantage of focusing reflected light, which has not been frequency doubled, back onto nonlinear optical material 24, through lasant material 18 and onto the coating on input surface 20. As set forth above, in a preferred embodiment, this coating on surface 20 is highly reflective of both frequency doubled and unmodified light from the lasing of lasant material 18. Thus, frequency-unmodified light reflected by the coating on surface 28 is partially frequency doubled by passage through nonlinear optical material 24, the resulting mixture of wavelengths is reflected from the coating on input surface 20 back through nonlinear optical material 24 where some of the residual frequency-unmodified light is frequency doubled, and the frequency doubled light is emitted through output coupler 26. Except for losses which may occur as a result of processes such as scattering or absorption, further repetition of this series of events results in essentially all of the light produced by the lasing of lasant material 18 being frequency doubled and emitted through output coupler 26.

Figure 3:
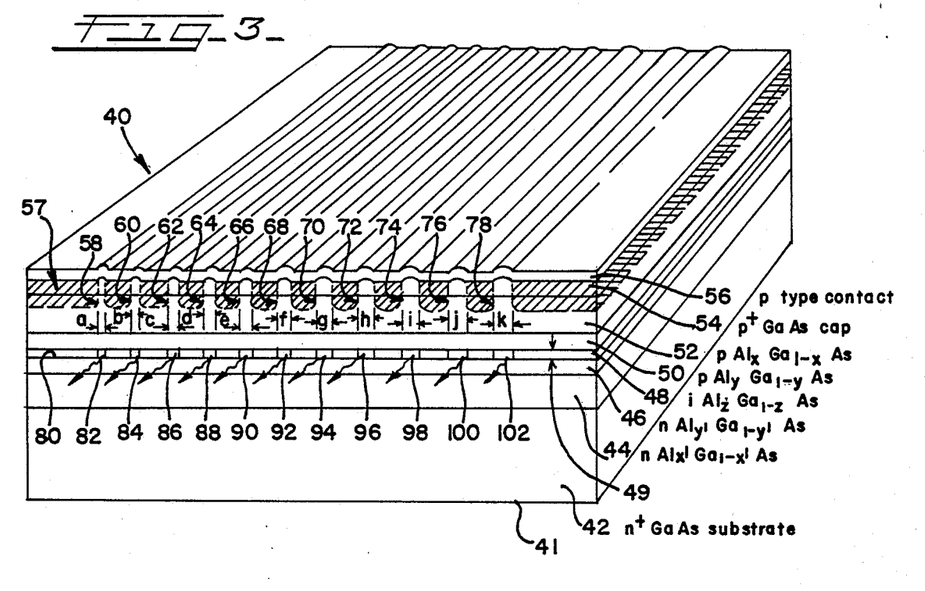
FIG. 3 of the drawings is a perspective view of a laser diode array suitable for use in the practice of this invention.

Referring to FIG. 3, there is schematically shown a laser diode array 40 which is suitable for use as a source of optical pumping radiation in the practice of this invention. The fabrication of this diode array 40, as well as other laser structures hereinafter described, can be carried out by liquid-phase epitaxy, molecular beam epitaxy and metal-organic chemical vapor deposition, which techniques are known in the art. Deposited on substrate 42 are layers 44, 46, 48, 50, 52, 54, and 56. Substrate 42 can be an n+GaAs substrate. Layers 44 and 52 are confining layers, typically about 1 $\mu$m thick, which can comprise $nAl_x$, $Ga_{1-x}$, As and $pAl_xGa_{1-x}As$, respectively. Layers 46 and 50 are waveguide layers typically less than or about equal to 0.2 nm thick, which can comprise $nAl_y$, $Ga_{1-y}$, As and $pAl_yGa_{1-y}As$, respectively. Layer 48 is an active region or quantum well having a thickness 49 typically less than or about equal to 0.2 $\mu$m, which can comprise $iAl_zGa_{1-z}As$. Values for x and x', y and y', and z typically range from about 0.3 to 1.0, 0.1 to 0.5, and 0.0 to 0.1, respectively, but are not limited to such ranges. Layer 54 is a cap, typically less than or about equal to 0.2 $\mu$m thick, which can comprise p+GaAs. And layer 56 is a conductive layer typically made of a gold/chromium composition or equivalent thereof.

As recognized in the art, the conductivity type of the above layers can be reversed, which is also true for later described embodiments.

A power supply is not included in the figures. As is understood by those skilled in the art, the laser diodes, light emitting lasers and laser diode arrays illustrated herein are properly forward biased by applying a positive charge at the appropriate place to energize laser diode array 40, and the other diode arrays in FIGS. 4–11. Layer 56 provides a metalization layer for electrode connection and current pumping. Also, the bottom surface 41 of substrate 42 can be metalized to provide a contact for the other electrode connection. This metalization is conductive and can be made of a gold/tin or gold/germanium alloy.

In a conventional laser diode array, the number of strips is significant from the point of desired power output. Generally, an increase in the number of strips will proportionally increase the optical power output at a desired wavelength. See FIG. 2c in phantom wherein the emission spectrum of a conventional laser diode array centered at 808 nm is illustrated. Also, the higher the number of emitting cavities, the higher the obtainable peak power output. Typically, laser diode arrays include active layers which have the highest index of refraction and a low bandwidth to provide a waveguide for light wave propagation at a single wavelength under lasing conditions. However, such laser diode arrays require sensitive and sophisticated feedback circuitry and/or thermoelectric heaters/coolers to carefully match the output radiation of the array with the absorption peak of the lasant material, which is in sharp contrast to laser diode array 40. Further, because the bandwidth of the laser diode array 40 is wider than in conventional narrow bandwidth laser diodes, the radiation emitted therefrom is more stable and, less temperature and current sensitive, and less sensitive to aging variations.

The current confining channel geometry shown in FIG. 3 comprises 11 parallel contact strips which run the length of diode array 40. However, any number of strips can be utilized in the practice of this invention. A conventional proton implant 57 is included which patterns lateral regions of high and low resistive material in a semi-conductor device to channel current to a specific region in a device when properly biased. When laser diode array 40 is energized or forwarded biased, current is confined to the eleven elongated and narrow strips: 58, 60, 62, 64, 66, 68, 70, 72, 74, 76 and 78 and channeled to the adjacent and corresponding strip areas or emitting cavities 82, 84, 86, 88, 90, 92, 94, 96, 98, 100 and 102, respectively, of active layer 48.

Each of the above strips has varying widths for confining current flow to the plurality of strip areas or emitting cavities of the active layer 48. Each strip area emits pumping radiation under lasing conditions different from that of each adjacent strip area, thereby providing a stable, uniformly distributed wide bandwidth laser diode array which is less sensitive to temperature and current variations, and less sensitive to aging variations.

The first strip 58 includes a width designated as a in FIG. 3, ranging from 0.9 um to 1.1 um, preferably 1 um, the second strip 60 includes a width b ranging from 1.12 um to 1.37 um, preferably 1.25 um, the third strip 62 includes a width c ranging from 1.22 um to 1.73 um, preferably 1.57 um, the fourth strip 64 includes a width d ranging from 1.8 um to 2.2 um, preferably 2 um, the fifth strip 66 includes a width e ranging from 2.25 um to 2.75 um, preferably 2.5 um, the sixth strip 68 includes a width f ranging from 2.83 um to 3.47 um, preferably 3.15 um, the seventh strip 70 includes a width g ranging from 3.6 um to 4.4 um, preferably 4 um, the eighth strip 72 includes a width h ranging from 4.5 um to 5.5 um, preferably 5 um, the ninth strip 74 includes a width i ranging from 5.67 um to 6.93 um, preferably 6.3 um, the tenth strip 76 includes a width j ranging from 7.11 um to 8.69 um, preferably 7.9 um, and the eleventh strip 78 includes a width k ranging from 9 um to 11 um, preferably 10 um.

It is important to note that the sixth strip 68 width f is designed to provide a wavelength from sixth strip emitting cavity 92 that substantially matches the lasant material absorption peak or window. For example, about 808 nm for neodymium-doped YAG. If this is done properly, laser diode array 40 can have a longer useful life than conventional laser diode arrays, because as the characteristics of each member strip area in active layer 48 change, due to aging, the wide bandwidth will continue to provide consistent radiation at the appropriate absorption peak of the lasant material. Similarly, temperature and pressure variations will not interrupt the constant pumping of the lasant material 18 by radiation from active layer 48, resulting in a steady and constant laser light output from lasant material 18.

Figure 2C:
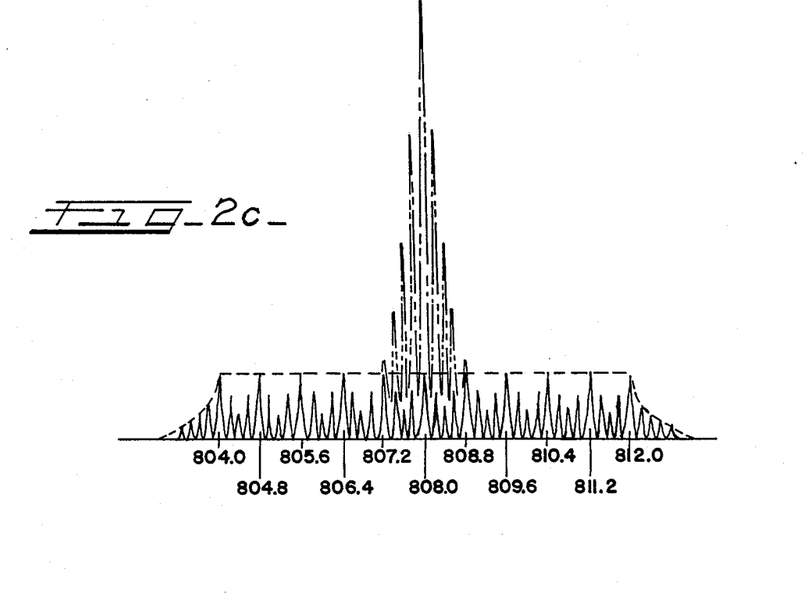
FIG. 2c is a graph of the emission spectrum of a second diode array comprised of eleven strips suitable for use in the practice of this invention. A conventional laser diode array emission spectrum is also shown in phantom.

Under lasing conditions light in and about active layer 48 is produced at various wavelengths as illustrated in FIG. 2c. The pumping radiation bandwidth of this embodiment is about 10 nm wide, and the intensity of such pumping radiation is substantially uniform over such bandwidth, as illustrated in the dashed waveform of FIG. 2c. The first strip emitting cavity or strip area 82 of active layer 48 emits light centered at a wavelength ranging from 803.2 nm to 804.8 nm, preferably 804.0 nm, the second strip emitting cavity 84 emits light at a wavelength ranging from 804 nm to 805.6 nm, preferably 804.8 nm, the third strip emitting cavity 86 emits light at a wavelength ranging from 804.8 nm to 806.4 nm, preferably 805.6 nm, the fourth strip emitting cavity 88 emits light at a wavelength ranging from 805.6 nm to 807.2 nm, preferably 806.4 nm, the fifth strip emitting cavity 90 emits light at a wavelength ranging from 806.4 nm to 808.0 nm, preferably 807.2 nm, the sixth strip emitting cavity 92 emits light at a wavelength ranging from 807.2 nm to 808.8 nm, preferably 808.0 nm, the seventh strip emitting cavity 94 emits light at a wavelength ranging from 808.0 nm to 809.6 nm, preferably 808.8 nm, the eighth strip emitting cavity 96 emits light at a wavelength ranging from 808.8 nm to 810.4 nm, preferably 809.6 nm, the ninth strip emitting cavity 98 emits light at a wavelength ranging from 809.6 nm to 811.2 nm, preferably 810.4 nm, the tenth strip emitting cavity 100 emits light at a wavelength ranging from 810.4 nm to 812.0 nm, preferably 811.2 nm, and the eleventh strip emitting cavity 102 emits light at a wavelength ranging from 811.2 nm to 812.8 nm, preferably 812.0 nm.

Figure 4:
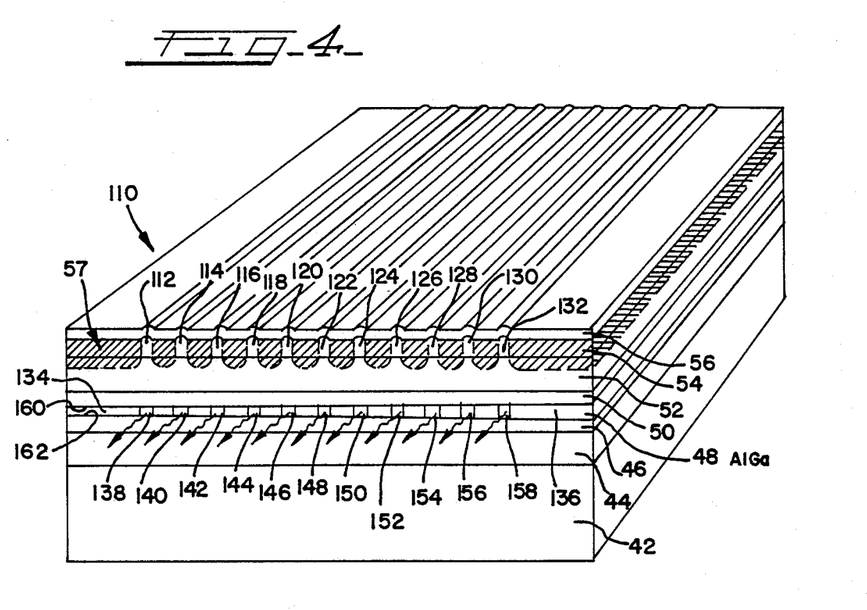
FIG. 4 of the drawings is a perspective view of another laser diode array suitable for use in the practice of this invention.

Referring to FIG. 4, there is schematically shown another laser diode array 110 which is suitable for use in the practice of this invention. The laser diode array 110 includes a substrate 42 and several layers 44, 46, 48, 50, 52, 54 and 56 with proton implant region 57. The active layer 48 in diode array 110 comprises $iAl_zGa_{1-z}As$, where z equals zero.

The diode array 110 includes a plurality of elongated strips. Any number of strips can be utilized in the practice of this invention. Laser diode array utilizes eleven strips comprising a first strip 112, a second strip 114, a third strip 116, a fourth strip 118, a fifth strip 120, a sixth strip 122, a seventh strip 124, an eighth strip 126, a ninth strip 128, a tenth strip 130 and an eleventh strip 132. The width of each of the above strips is substantially the same, ranging from about 2.5 um to about 5 um, preferably about 3.5 um for the gain guided lasers discussed herein. Each strip is separated by a resistive material or proton implant region 57 sandwiched between each strip 112, 114, 116, 118, 120, 122, 124, 126, 128, 130 and 132.

The active layer 48 of FIG. 4 includes a left portion 134 and a right portion 136. The cross section of active layer 48 perpendicular to the direction of light emission is substantially wedge shaped. The thickness of active layer 48 can range from about 20Å to about 200Å, but preferably ranges from about 50Å at left portion 134 to about 70Å at the right portion 134 thereof. The active layer 48 of laser diode array 110 is wedged-shaped to provide stable pumping radiation uniformly distributed over a broad bandwidth to a lasant material, thereby providing an improved and more stable laser diode array which provides enhanced stability despite aging and temperature, pressure, and current variations. Similar in many respects to laser diode array 40, laser diode array 110 is designed so that the active layer adjacent to the middle strip or sixth strip 122 emits radiation at or near the absorption peak of the lasant material, for example, at about 808 nm for neodymium-doped YAG, thereby providing a more stable laser diode array than conventional arrays.

More particularly, moving from the left portion 134 to the right portion 136 of active layer 48, there is a first emitting strip area 138 having a layer thickness ranging from 48Å to 52Å, preferably 50Å, a second strip emitting area 140 having a layer thickness ranging from 50Å to 54Å, preferably 52Å, a third strip emitting area 142 having a layer thickness ranging from 52Å to 56Å, preferably 54Å, a fourth strip emitting area 144 having a layer thickness ranging from 54Å to 58Å, preferably 56Å, a fifth strip emitting area 146 having a layer thickness ranging from 56Å to 60Å, preferably 58Å, a sixth strip emitting area 148 having a layer thickness ranging from 58Å to 62Å, preferably 60Å, a seventh strip emitting area 150 having a layer thickness ranging from 60Å to 64Å, preferably 62Å, an eighth strip emitting area 152 having a layer thickness ranging from 62Å to 66Å, preferably 64Å, a ninth strip emitting area 154 having a layer thickness ranging from 64Å to 68Å, preferably 66Å, a tenth strip emitting area 156 having a layer thickness ranging from 66Å to 70Å, preferably 68Å, and an eleventh strip emitting area 158 having a layer thickness ranging from 68Å to 72Å, preferably 70Å, all of which are adjacent to, parallel with and below each respective strip 112, 114, 16, 118, 120, 122, 124, 126, 128, 130, and 132.

The wedge-shaped active layer 48 has an upper and lower heterojunction 160 and 162, respectively. Under lasing conditions, laser diode array 110 has an emission spectrum as illustrated in the dashed waveform in FIG. 2c, wherein a light is emitted from the first strip emitting area 138 at a wavelength ranging from 803.2 nm to 804.8 nm, preferably 804.0 nm, the second strip emitting area 140 at a wavelength ranging from 804 nm to 805.6 nm, preferably 804.8 nm, the third strip emitting area 142 at a wavelength ranging from 804.8 nm to 806.4 nm, preferably 805.6 nm, the fourth strip emitting area 144 at a wavelength ranging from 805.6 nm to 807.2 nm, preferably 806.4 nm, the fifth strip emitting area 146 at a wavelength ranging from 806.4 nm to 808.0 nm, preferably 807.2 nm, the sixth strip emitting area 148 at a wavelength ranging from 807.2 nm to 808.8 nm, preferably 808.0 nm, the seventh strip emitting area 150 at a wavelength ranging from 808.0 nm to 809.6 nm, preferably 808.8 nm, the eighth strip emitting area 152 at a wavelength ranging from 808.8 nm to 810.4 nm, preferably 809.6nm, the ninth strip emitting area 154 at a wavelength ranging from 809.6 nm to 811.2 nm, preferably 810.4 nm, the tenth strip emitting area 156 at a wavelength ranging from 810.4 nm to 812.0 nm, preferably 811.2 nm, and the eleventh strip emitting area 158 at a wavelength ranging from 811.2 nm to 812.8 nm, preferably 812 nm, assuming the absorption peak of the lasant material is at about 808.0 nm.

If, for example, the absorption peak of the lasant material were at 806.0 nm instead of 808.0 nm, than the sixth strip emitting area 148 layer thickness would be modified so that sixth strip emitting area 148 would emit light at about 806 nm. Accordingly, in such an example, all of the wavelength values given in the preceding paragraph would be decreased by 2 nm.

Figure 5:
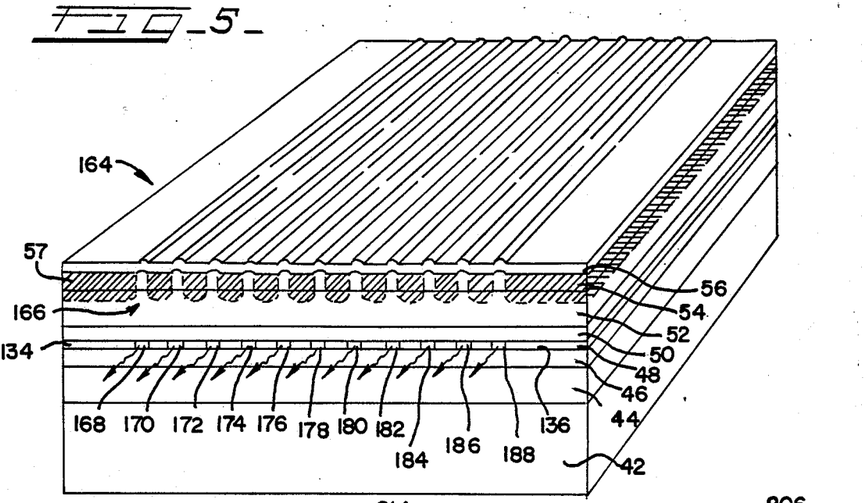
FIG. 5 of the drawings is a perspective view of yet another laser diode array suitable for use in the practice of this invention.

Referring to FIG. 5, there is depicted another laser diode array which is suitable for use in the practice of this invention. Laser diode array 164 includes a substrate 42 and layers 44, 46, 48, 50, 52, 54 and 56, with proton implant region 57. Active layer 48 includes a left portion 134 and a right portion 136. As is understood by those skilled in the art, any number of strips can be used in the practice of this invention. Laser diode array 164 includes a plurality of eleven strips 166, all having the same widths and lengths, each of the lengths coextensive with laser diode array 164.

The active layer 48 of FIG. 5 includes the formula $Al_zGa_{1-z}As$. In a first example of FIG. 5, the aluminum content or value of z varies from about 0.0926 at the left portion 134 to about 0.079 at the right portion 136 of active layer 48. One approach which has been used in the fabrication of an AlGaAs multiple wavelength light emitting bar or diode is described by J. E. Epler in *Appl. Phys. Lett.*, Vol. 52, No. 18, 1988, pp. 1499–1501. The Al composition of the active layer and emission wavelength, varies as a function of position along the bar.

In a second example of FIG. 5, the value of z remains constant, at 7 atomic % or less, and a concentration of an n-type or p-type dopant is varied from the left portion 134 to the right portion 136 of active layer 48.

Similar in many respects to the preceding laser diode arrays 40 and 110 in FIGS. 3 and 4, in both examples of laser diode array 164, the value of z or a dopant concentration is varied across active layer 48, to provide a laser diode array for generating optically pumped radiation having a uniform intensity distributed over a broad bandwidth to pump a lasant material, with the absorption band of the lasant material receiving radiation within such bandwidth.

The active layer 48 includes several emitting areas directly below and adjacent to a plurality of eleven strips 166. The active layer 48 includes a first strip emitting area 168, a second strip emitting area 170, a third strip emitting area 172, a fourth strip emitting area 174, a fifth strip emitting area 176, a sixth strip or middle emitting area 178, a seventh strip emitting area 180, an eighth strip emitting area 182, a ninth strip emitting area 184, a tenth strip emitting area 186 and an eleventh strip emitting area 188.

In one example of the first embodiment of laser device 164 in FIG. 5, the first strip emitting area 168 has an aluminum composition or z value in the formula $Al_zGa_{1-z}As$ ranging from 0.0926 to 0.0904, preferably 0.0916, the second strip emitting area 170 has a z value ranging from 0.0916 to 0.0892, preferably 0.0904, the third strip emitting area 172 has a z value ranging from 0.0904 to 0.0881, preferably 0.0892, a fourth strip emitting area 174 has a z value ranging from 0.0892 to 0.0869, preferably 0.0881, a fifth strip emitting area 176 has a z value ranging from 0.0881 to 0.0858, preferably 0.0869, a sixth strip emitting area 178 has a z value ranging from 0.0869 to 0.0846, preferably 0.0858, a seventh strip emitting area 180 has a z value ranging from 0.0858 to 0.0834, preferably 0.0846, an eighth strip emitting area 182 has a z value ranging from 0.0846 to 0.0823, preferably 0.0834, a ninth strip emitting area 184 has a z value ranging from 0.0834 to 0.0811, preferably 0.0823, a tenth strip emitting area 186 has a z value ranging from 0.0823 to 0.0800, preferably 0.0811, and an eleventh strip emitting area 188 has a z value ranging from 0.0811 to 0.0790, preferably 0.0800 (See Table 1).

TABLE 1

| Active Layer 48 Strip Emitting Area | Item No. in FIG. 5 | Wave Length (in nm) | 1st Ex. of FIG. 5 Preferred Value of z in Al$_z$Ga$_{z-1}$As | 2nd Ex. of FIG. 5, z approx. .07 Preferred n-type dopant concent. (× 10$^{18}$/cm$^3$) |
|---|---|---|---|---|
| 1st | 168 | 804.0 | .0916 | 4.0 |
| 2nd | 170 | 804.8 | .0904 | 4.2 |
| 3rd | 172 | 805.6 | .0892 | 4.5 |
| 4th | 174 | 806.4 | .0881 | 4.7 |
| 5th | 176 | 807.2 | .0869 | 5.0 |
| 6th | 178 | 808.0 | .0858 | 5.3 |
| 7th | 180 | 808.8 | .0846 | 5.6 |
| 8th | 182 | 809.6 | .0834 | 5.9 |
| 9th | 184 | 810.4 | .0823 | 6.2 |
| 10th | 186 | 811.2 | .0811 | 6.6 |
| 11th | 188 | 812.0 | .0800 | 7.0 |

The middle or sixth strip emitting area 178 of active layer 48 is designed to match the absorption peak of the lasant material. For a different absorption peak, the above z values or dopant concentrations would be modified so that the middle strip emitting area 178 would match the absorption peak of the lasant material.

In the second example of FIG. 5, the concentration of n-type or p-type dopants is varied from the left portion 134 to the right portion 136, of active layer 48. The p-type dopants can include magnesium, zinc, cadmium, beryllium, amphoteric dopants, carbon, silicon, germanium, tin, etc. and equivalents thereof. The n-type dopants can include tellurium, selenium, sulfur, and the amphoteric dopants, and equivalents thereof. The preferred n-type dopants are selenium, tellurium and silicon. For purposes of this application, an impurity that exhibits a donor level and/or an acceptor level, depending on the particular charge state in which it is incorporated, is referred to as an amphoteric dopant. As is known in the art, an amphoteric dopant is a material which can be used as an n-type or p-type dopant to dope a semiconductor, depending on how it is incorporated into the material.

In the second example, the composition of active region 48 is kept constant at about 0.07 (Al$_{.07}$Ga$_{.93}$As), but the doping concentration is varied. In particular, the n-type dopant can range from about 3.8×10$^{18}$/cm$^3$ at the left portion 134 of active layer 48, to about 7.5×10$^{18}$/cm$^3$ at the right portion 136 thereof. More specifically, the first strip emitting area 168 includes an n-type dopant ranging from 3.8×10$^{18}$/cm$^3$ to 4.2×10$^{18}$/cm$^3$, preferably 4.0×10$^{18}$/cm$^3$, the second strip area 170 includes an n-type dopant ranging from 4.0×10$^{18}$/cm$^3$ to 4.5×10$^{18}$/cm$^3$, preferably 4.2×10$^{18}$/cm$^3$, the third strip emitting area 172 includes an n-type dopant ranging from 4.2 10$^{18}$/cm$^3$ to 4.7×10$^{18}$/cm$^3$, preferably 4.5×10$^{18}$/cm$^3$, the fourth strip emitting area 174 includes an n-type dopant ranging from 4.5×10$^{18}$/cm$^3$ to 5.0×16$^{18}$/cm$^3$, preferably 4.7×10$^{18}$/cm$^3$, the fifth strip emitting area 176 includes an n-type dopant ranging from 4.7×10$^{18}$/cm$^3$ to 5.3×10$^{18}$/cm$^3$, preferably 5.0×10$^{18}$/cm$^3$, the sixth strip emitting area 178 includes an n-type dopant ranging from 5.0×10$^{18}$/cm$^3$ to 5.6×10$^{18}$/cm$^3$, preferably 5.3×10$^{18}$/cm$^3$, the seventh strip emitting area 180 includes an n-type dopant ranging from 5.3×10$^{18}$/cm$^3$ to 5.9×10$^{18}$/cm$^3$ preferably 5.6×10$^{18}$/cm$^3$, the eighth strip emitting area 182 includes an n-type dopant ranging from 5.6×10$^{18}$/cm$^3$ to 6.2×10$^{18}$/cm$^3$, preferably 5.9×10$^{18}$/cm$^3$, the ninth strip emitting area 184 includes an n-type dopant ranging from 5.9×10$^{18}$/cm$^3$ to 6.6×10$^{18}$/cm$^3$, preferably 6.2×10$^{18}$/cm$^3$, the tenth strip emitting area 186 includes an n-type dopant ranging from 6.2×10$^{18}$/cm$^3$ to 7.0×10$^{18}$/cm$^3$, preferably 6.6×10$^{18}$/cm$^3$, and the eleventh strip emitting area 188 includes an n-type dopant ranging from 6.6×10$^{18}$/cm$^3$ to 7.5×10$^{18}$/cm$^3$, preferably 7.0×10$^{18}$/cm$^3$ (See Table 1). See P. D. Dapkus, *J. Appl. Phys.*, 40, 3300 (1969), which describes how wavelengths varies with type and concentration of dopants. The emission spectrum of the first and second embodiments of FIG. 5 are illustrated in the dashed waveform of FIG. 2c.

Figures 6A, 6B:
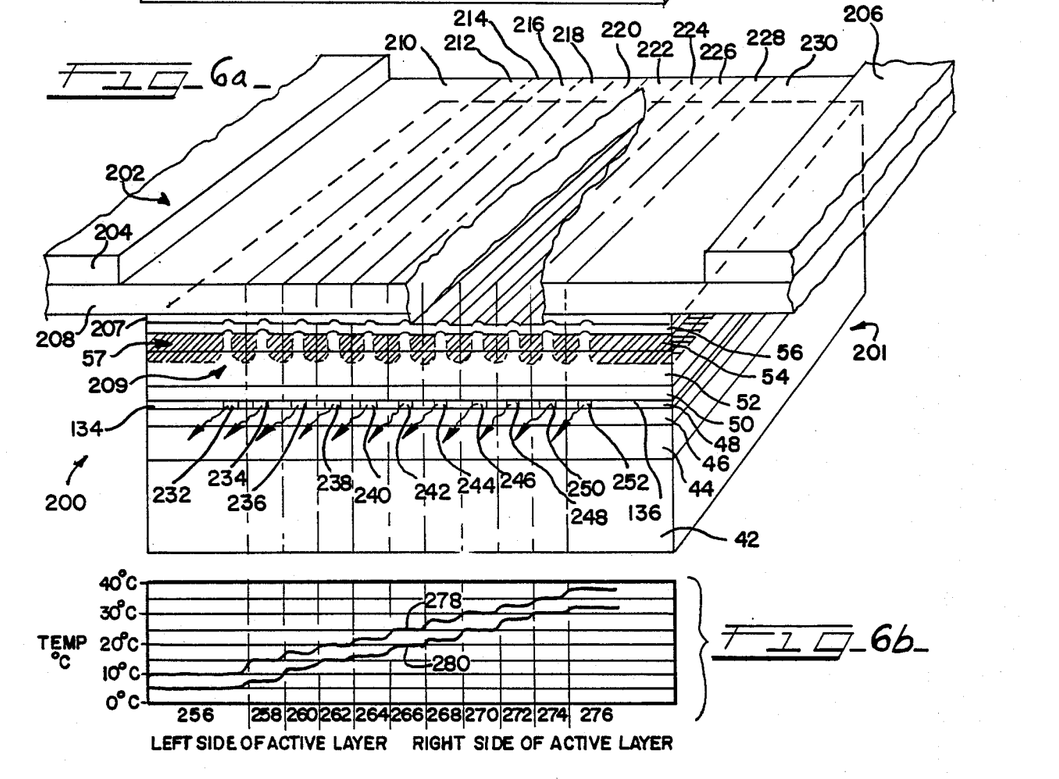

In FIG. 6a is yet another illustrative embodiment of a laser diode array that is suitable for use in the practice of the subject invention. Laser device 200 includes laser diode array 201 which includes a substrate 42 and layers 44, 46, 48, 50, 52, 54 and 56, with proton implant region 57. Directly above and adjacent to laser diode array 201 is a temperature varying means 202.

The strip emitting area 242 emits light at about 808nm which is the lasant materials absorption peak in this example. This structure is designed to operate with ambient temperature ranging from about −30° C. to about +100° C.

The temperature varying means 202 can be utilized to apply a temperature gradient across the active layer 48 of laser diode array 201, to temperature tune array 201 to emit a plurality of distinct wavelengths, to produce a multi-wavelength laser diode array or pump which has improved stability despite temperature and current variations.

The temperature varying means 202 includes a left portion or thermoelectric heater/cooler 204, a right portion or thermoelectric heater/cooler 206 and an intermediate portion or electrically and thermally conductive plate 208. The conductive plate 208 is positioned above, adjacent and parallel to the plurality of eleven strips 209 of laser diode array 201. Again, as is understood in the art, any number of strips can be used in the practice of this invention. The strips 209 have approximately equal strip widths and lengths. Sandwiched between the device 200 and conductive plate 208, is an adhering solder layer 207, which can comprise indium, or a gold/tin eutectic.

The conductive plate 208 includes a first strip portion 210, a second strip portion 212, a third strip portion 214, a fourth strip portion 216, a fifth strip portion 218, a sixth strip portion 220, a seventh strip portion 222, an eighth strip portion 224, a ninth strip portion 226, a tenth strip portion 228 and an eleventh strip portion 230. All of the above strip portions are adjacent, elongated and coextensive with the plurality of eleven strips 209 and the laser diode array 201.

A first temperature is generated by left thermoelectric heater/cooler 204 and a second different temperature applied by right theromoelectric heater/cooler 206 of temperature varying means 202, through conductive plate 208, so as to apply a temperature gradient across the active layer 48, thereby producing light from active layer 48 at a plurality of distinct wavelengths as illustrated in FIG. 2c. The temperature coefficient of wavelength in laser device 201 of FIG.6a, is approximately 0.27 to 0.3 nm/° C. The laser diode array 201 can be temperature tuned so that each strip of the plurality of eleven strips 209 is tuned to a distinct and different wavelength from each strip immediately adjacent thereto, to produce a multi-wavelength laser diode pump, having the characteristics illustrated in the dashed waveform of FIG. 2c. The laser diode array 201 effectively provides a source of stable and constant emission at the appropriate absorption wavelength of the lasant material, despite temperature and current variations and fluctuations and aging of the device 201.

The left and right thermoelectric heater/cooler 204 and 206 of temperature varying means 202, each include not only separate and independent thermoelectric heater/coolers, but also independent thermal sensors and feed-back circuits. When in use, the thermoelectric heater/coolers 204 and 206 can each be set and controlled independently, anywhere from about 0° C. to about 60° C.

The thermoelectric heater/coolers 204 and 206 are conventional in nature, and can be monitored using conventional temperature sensors, such as thermocouples, thermistors, etc. When the temperature deviates from a desired value, a voltage is produced in the sensing circuits. The sign of this voltage indicates whether the temperature is warmer or colder than the pre-set null point. Current is automatically supplied in the direction necessary to correct the temperature drift. Each cooler also includes an adequate heat sink to dissipate and absorb heat in order to maintain the required temperature gradient.

The active layer 48 includes corresponding strip emitting areas below and adjacent to the above described conductive plate strip portions 210, 212, 214, 216, 218, 220, 222, 224, 226, 228 and 230. A first strip emitting area 232 of active layer 48 is directly below and adjacent to first strip portion 210 of conductive plate 208. Similarly, a second strip emitting area 234 of active layer 48 is below and adjacent to second strip portion 212, a third strip emitting area 236 is below and adjacent to third strip portion 214, a fourth strip emitting area 238 is below and adjacent to fourth strip portion 216, a fifth strip emitting area 240 is below and adjacent to fifth strip portion 218, a sixth strip emitting area 242 is below and adjacent to sixth strip portion 220, a seventh strip emitting area 244 is below and adjacent to seventh strip portion 222, an eighth strip emitting area 246 is below and adjacent to eighth strip portion 224, a ninth strip emitting area 248 is below and adjacent to ninth strip portion 226, a tenth strip emitting area 250 is below and adjacent to tenth strip portion 228 and an eleventh strip emitting area 252 is below and adjacent to eleventh strip portion 230.

In FIG. 6b, a temperature versus position graph 254 illustrates the temperature ranges and variations applied to active layer 48 from conductive plate 208, moving from the left to the right side 134 to 136 of active layer 48. A first position 256 indicates that first strip portion 210 of conductive plate 208, applies a temperature t first strip emitting area 232 of active layer 48 ranging from 6° C. to 11.33° C., preferably 8.67° C. Similarly, a second position 258 indicates that second strip portion 212 applies a temperature to second strip emitting area 234 ranging from about 8.67° C. to about 14° C., preferably 11.33° C., a third position 260 indicates that third strip portion 214 applies a temperature to third strip emitting area 236 ranging from 11.33° C. to 16.67° C., preferably 14° C., a fourth position 262 indicates that fourth strip portion 216 applies a temperature to fourth strip emitting area 238 ranging from 14° C. to 19.33° C., preferably 16.67° C., a fifth position 264 indicates that fifth strip portion 218 applies a temperature to fifth strip emitting area 240 ranging from 16.67° C. to 22° C., preferably 19.33° C., a sixth position 266 indicates that middle or sixth strip portion 220 applies a temperature to sixth strip emitting area 242 ranging from 19.33° C. to 24.6° C., preferably 22° C., a seventh position 268 indicates that seventh strip portion 222 applies a temperature to seventh strip emitting area 244 ranging from 22° C. to 27.33° C., preferably 24.67° C., an eighth position 270 indicates that eighth strip portion 224 applies a temperature to eighth strip emitting area 246 ranging from 24.67° C. to 30° C., preferably 27.33° C., a ninth strip position 272 indicates that ninth strip portion 226 applies a temperature to ninth strip emitting area 248 ranging from 27.33° C. to 32.67° C., preferably 30° C., a tenth strip position 274 indicates that tenth strip portion 228 applies a temperature to tenth strip emitting area 250 ranging from 30° C. to 35.33° C., preferably 32.64° C., and an eleventh strip position 276 indicates that eleventh strip portion 230 applies a temperature to eleventh strip emitting area 252 ranging from 32.68° C. to 38° C., preferably 35.33° C. under operating and lasing conditions (See Table 2).

The device 200 is designed so that the middle or sixth strip 242 when operating and lasing, emits a light matching the absorption window or peak of the lasant material, thereby enhancing stability despite temperature and pressure variations and aging of device 200, similar in many respects to arrays 40, 110 and 164 in FIGS. 3, 4 and 5, respectively.

TABLE 2

| Item No. | Active Layer 48 Strip Emitting Area | Preferred Emission Wavelength | Preferred Temperature |
| --- | --- | --- | --- |
| 1 | 232 | 804.0 | 8.67° C. |
| 2 | 234 | 804.8 | 11.33° C. |
| 3 | 236 | 805.6 | 14° C. |
| 4 | 238 | 806.4 | 16.67° C. |
| 5 | 240 | 807.2 | 19.33° C. |
| 6 | 242 | 808.0 | 22° C. |
| 7 | 244 | 808.8 | 24.67° C. |
| 8 | 246 | 809.6 | 27.33° C. |
| 9 | 248 | 810.4 | 30° C. |
| 10 | 250 | 811.2 | 32.67° C. |
| 11 | 252 | 812.0 | 35.33° C. |

The middle or sixth strip emitting area 242 emits light under lasing conditions at about the lasant materials absorption peak. For a different absorption peak, the preferred temperatures would be modified so that the middle strip emitting area 242 would match the absorption peak.

Figure 7:
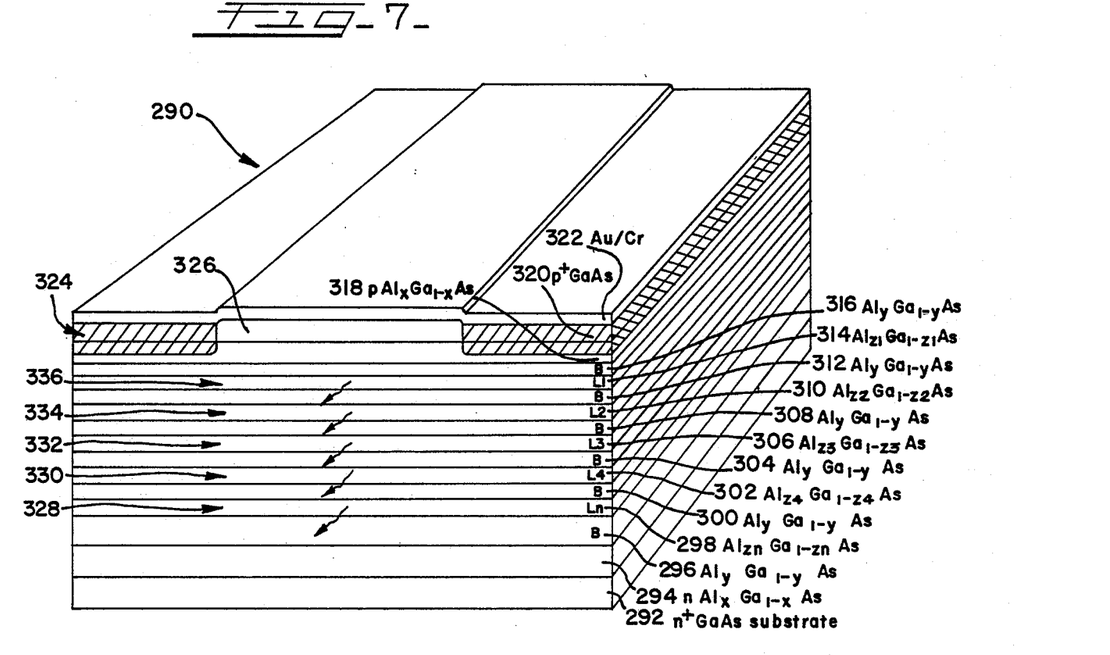
FIG. 7 of the drawings is a perspective view of still another laser diode array suitable for use in the practice of this invention.

In FIG. 7, there is schematically shown another laser diode array 290 which is suitable for use in the practice of this invention. The laser diode array 290 can have any number of active layers, however the array 290 in FIG. 7 only illustrates five such layers. At the bottom of laser diode array 290 is n+GaAs substrate 292 with a plurality of layers stacked above in the following order: n $Al_xGa_{l-x}As$ layer 294, $Al_yGa_{l-y}As$ barrier 296, $Al_zGa_{l-z}As$ fifth active layer 298, $Al_yGa_{l-y}As$ barrier 300, $Al_{z4}Ga_{l-z4}As$ fourth active layer 302, $Al_yGa_{l-y}As$ barrier 304, $Al_{z3}Ga_{l-z3}As$ third active layer 306, $Al_yGa_{l-y}As$ barrier 308, $Al_{z2}Ga_{l-z2}As$ second active layer 310, $Al_yGa_{l-y}As$ barrier 312, $Al_{zl}Ga_{l-zl}As$ first active layer 314, $Al_yGa_{l-y}As$ barrier 316, $pAl_xGa_{l-x}As$ layer 318, p+GaAs layer 320, and Au/Cr layer 322 at the top, with a proton implant region 324. The typical value of y ranges from about 0.2 to 1.0, but is not limited to such range.

The first and second examples of laser diode array 290 in FIG. 7, are similar in many respects to the laser diode array 164 in FIG. 5. The bandwidth of laser diode array 290 is about 5 nm wide, and is more stable despite temperature and current variations and fluctuations than conventional laser diode arrays, because of the wide bandwidth. Laser diode array 290 eases and relaxes the requirements of wavelength matching between the laser diode array and the absorption band of the lasant material, which also provides a stable output radiation from the lasant material. In contrast, the characteristics of conventional laser diode arrays change and drift after several hours of lasing, which makes it more difficult to apply radiation at the appropriate absorption peak of the lasant material.

Laser diode array 290 only has one elongated strip 326, having a width ranging from about 50 um to 150 um, preferably 100 um. Strip 326 is coextensive with and runs the length of laser diode array 290, typically, about 400 um long. Active layers 298, 302, 306, 310 and 314 each have a center area 328, 330, 332, 334 and 336, respectively, which produce or emit light under lasing conditions at different or distinct wavelengths.

As recognized by those skilled in the art, any number of active layers can be used. In a first example suitable for practice of this invention, the fifth active layer 298 value of $z5$ in $Al_{z5}Ga_{1-z5}As$ ranges from about 0.0846 to 0.0823, preferably 0.0834, the value of $z4$ in fourth active layer 302 ranges from about 0.0834 to 0.0858, preferably 0.0846, the value of $z3$ in third active layer 306 ranges from about 0.0846 to 0.0869, preferably 0.0858, the value of $z2$ in the second active layer 310 ranges from about 0.0858 to 0.0881, preferably 0.0869, and the value of $z1$ in first active layer 314 ranges from about 0.0869 to 0.0892, preferably 0.0881, but are not limited to such ranges.

The bandwidth of laser diode array 290 is about 5 nm wide. If, for example, the absorption peak of the lasant material is at about 808 nm, then the wavelength emitted for fifth active layer 298, fourth active layer 302, third active layer 306, second active layer 310, and first active layer 314, are adjusted to about 809.6 nm, 808.8 nm, 808.0 nm, 807.2 nm and 806.4 nm, respectively by appropriate selection of the composition for each layer. The bandwidth of laser device 290 is about half as wide as that illustrated in the dashed waveform of FIG. 2c. The intensity of the pumping radiation in laser device 290 would however be uniformly distributed across such bandwidth.

In a second example of the device illustrated by FIG. 7, the values of $z5$, $z4$, $z3$, $z2$, and $z1$ are constant at about 0.07, and the concentration of n-type dopants include about 5.9, 5.6, 5.3, 5.0 and $4.7 \times 10^{18}/cm^3$ in active layers 298, 302, 306, 310 and 314, respectively, each of the above active layers producing and emitting light at about the same wavelengths and uniform distribution, as discussed in the preceding paragraph.

Figure 8:
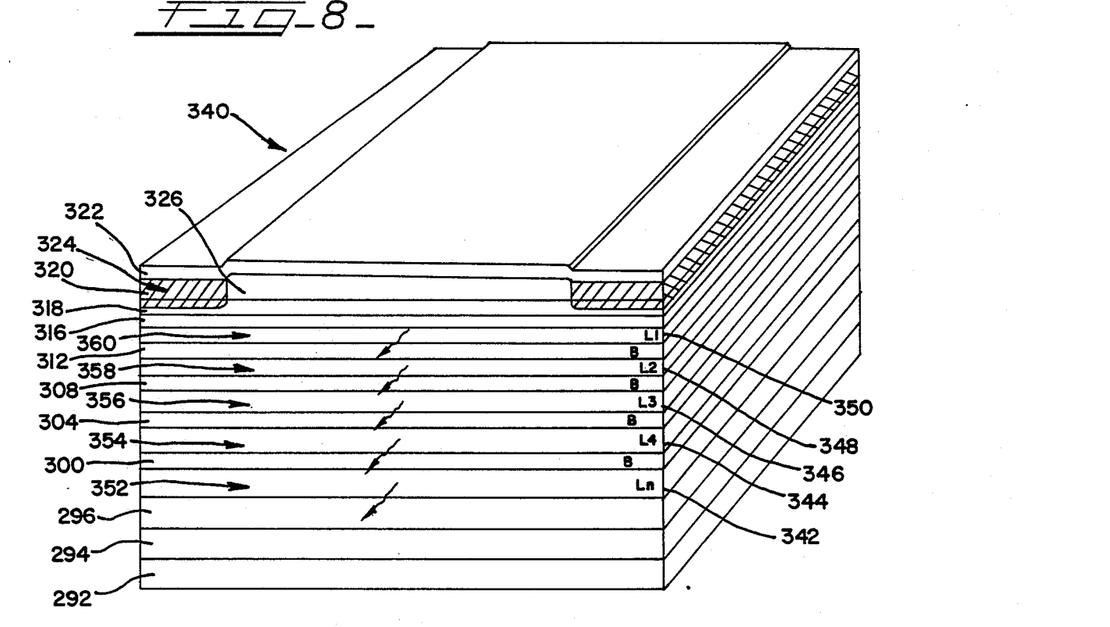
FIG. 8 of the drawings is a perspective view of still another laser diode array suitable for use in the practice of this invention.

FIG. 8 illustrates yet another laser diode array 340 which is suitable for use in the practice of the instant invention. Laser diode array 340 includes substrate 292, layer 294, barrier 296, fifth active layer 342, barrier 300, fourth active layer 344, barrier 304, third active layer 346, barrier 308, second active layer 348, barrier 312, first active layer 350, barrier 316, layer 318, layer 320, and layer 322, with proton implant region 324, however, any number of active layers may be used in the practice of this invention. The elongated strip 326 is coextensive with and spans the length of array 340. Active layers 342, 344, 346, 348, and 350 comprise GaAs. Each active layer has a different layer thickness than each adjacent active layer, and each emits a light at a distinct wavelength from center areas 352, 354, 356, 358, and 360, respectively, under lasing conditions, to produce laser light which is more stable than conventional laser diode arrays, despite temperature and current variations.

In laser diode array 340 the fifth active layer 342 thickness ranges from 62Å to 66Å, preferably 64Å emitting light having a wavelength of about 809.6 nm, the fourth active layer thickness 344 ranges from 60Å to 64Å, preferably 62Å, emitting light having a wavelength of about 808.8 nm, the third active layer thickness 346 ranges from 58Å to 62Å, preferably 60Å, emitting light having a wavelength of about 808.0 nm, (assuming the absorption peak of the lasant material is at about 808 nm), the second active layer thickness 348 ranges from 56Å to 60Å, preferably 58Å, emitting light having a wavelength of about 807.2 nm, and the first active layer thickness 350 ranges from 54Å to 58Å, preferably 56Å, emitting light having a wavelength of about 806.4 nm under lasing conditions. The thickness of the above active layers vary in a manner similar to the variation of thicknesses in the strips in FIG. 3.

Figure 9:
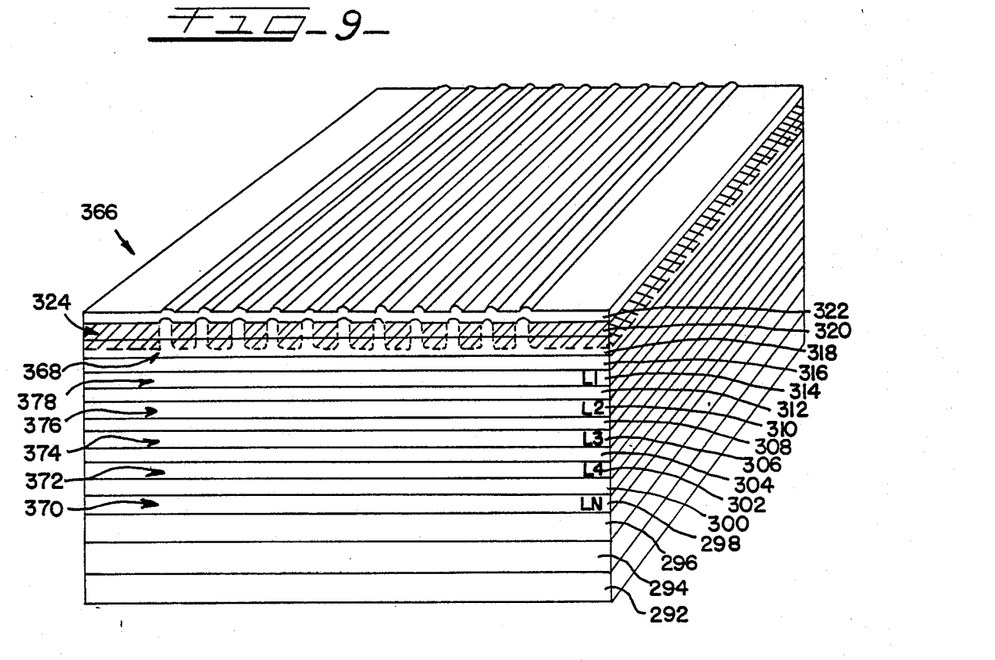
FIG. 9 of the drawings is a perspective view of yet another laser diode array suitable for use in the practice of this invention.

Referring to FIG. 9, is another laser diode array 366, similar in many ways to the laser diode array 290 in FIG. 7. The laser diode array 366 in FIG. 9 includes substrate 292 and layers 294, 296, 298, 300, 302, 304, 306, 308, 310, 312, 314, 316, 318, 320, and 322 and proton implant area 324. These layers are the same as those illustrated in FIG. 7. In the laser diode array 366, as with the device of FIG. 7, the value of $z5$, $z4$, $z3$, $z2$, and $z1$ in each active layer 298, 302, 306, 310 and 314 can vary. In a second example of FIG. 9, n-type or p-type dopants can be incorporated into each active layer at various concentrations. As stated previously with respect to the preceding laser diode arrays, the value of $z$ and dopant concentrations vary in order to produce a substantially uniform radiation over a broad bandwidth, thereby providing a laser diode array with enhanced stability despite aging and temperature, and current variations.

The laser device 366 includes a plurality of 11 strips 368. However, any number of strips may be utilized in the practice of this invention. The fifth active layer 298, emits light ranging from about 808.8 nm to about 810.4 nm, preferably 809.6 nm, at strip area 370 below and adjacent to strips 368, the fourth active layer 302 emits light ranging from about 808.0 nm to about 809.6 nm, preferably 808.8 nm, at strip area 372 below and adjacent to strips 368, the third active layer 306 emits light ranging from about 807.2 nm to 808.8 nm, preferably 808.0 nm, at strip area 374 below and adjacent to strips 368, the second layer 310 emits light ranging from about 806.4 nm to 808.0 nm, preferably 807.2 nm, at strip area 376 below and adjacent to strips 368, and the first active layer 314 emits light ranging from about 805.6 nm to 807.2 nm, preferably 806.4 nm at strip area 378 below and adjacent to strips 368.

In the first example of FIG. 9, the values of $z5$, $z4$, $z3$, $z2$ and $z1$ of active layers 298, 302, 306, 310, and 314, respectively, are the same as previously discussed with respect to the first embodiment of laser diode array 290 in FIG. 7, for example about 0.0834, 0.0846, 0.0858, 0.0869 and 0.0881, respectively.

In the second example of FIG. 9, the concentrations of n-type dopants in active layers 298, 302, 306, 310 and 314, are the same as those previously discussed with respect to the second embodiment of laser diode array 290 in FIG. 7, for example, 5.9, 5.6, 5.3, 5.0 and $4.7 \times 10^{18} cm^3$, respectively.

Figure 10:
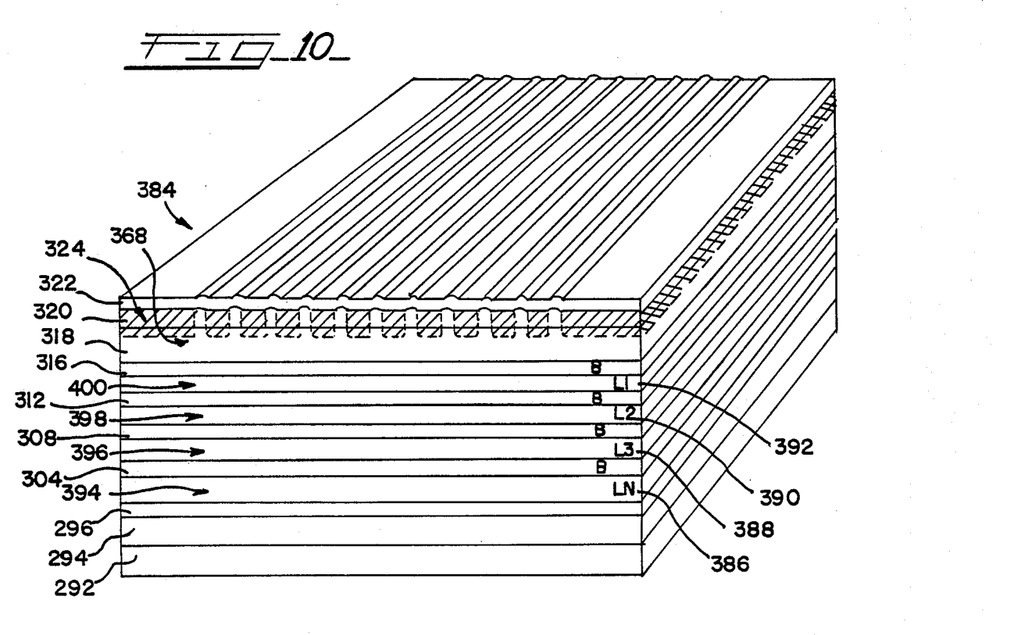
FIG. 10 of the drawings is a perspective view of another laser diode array suitable for use in the practice of this invention.

In FIG. 10 is yet another laser diode array which is suitable for use in the practice of the instant invention, and is similar in many respects to the laser diode array 40 of FIG. 8. In FIG. 10, a laser diode array 384 is shown which includes a substrate 292, and layers 294, 296, 86, 304, 388, 308, 390, 312, 392, 316, 318, 320 and 322, with a proton implant region 324. The above layers are the same as those illustrated in FIG. 8. Laser diode array 384 active layers 386, 388, 390 and 329 vary in thickness so that under lasing conditions, a substantially uniform radiation over a broad bandwidth is produced, thereby providing a laser diode array with enhanced stability despite temperature and current variations.

The fourth active layer 386 of laser diode array 384 is wider or thicker than the third active layer 388. The third active layer 388 is wider or thicker than the second active layer 390, and the second active layer 390 is wider or thicker than the first active layer 392. For example, the fourth active layer 386 thickness ranges from 64Å to 60Å, preferably 62Å, the third active layer thickness from 62Å to 58Å, preferably 60Å the second active layer 390 ranges from 60Å to 56Å, preferably 58Å, and the first active layer 382 ranges from 58Å to 54Å, preferably 56Å. Each active layer of laser device 384 comprises GaAs.

In laser diode array 384, strip area 394 of active layer 386 emits light below and adjacent to the plurality of strip 368 at about 809.6 nm, strip area 396 of the third active layer 388 emits light at about 808.8 nm, strip area 398 of the second active layer 390 emits light at about 808 nm, and the strip area 400 of the first active layer 392 emits light at about 807.2 nm, assuming the lasant material absorption peak is at about 808.5 nm. The thicknesses of the active layers in laser device 384 vary in a manner similar to the variation of the strip thicknesses in laser diode array 40 of FIG. 3.

Figure 11:
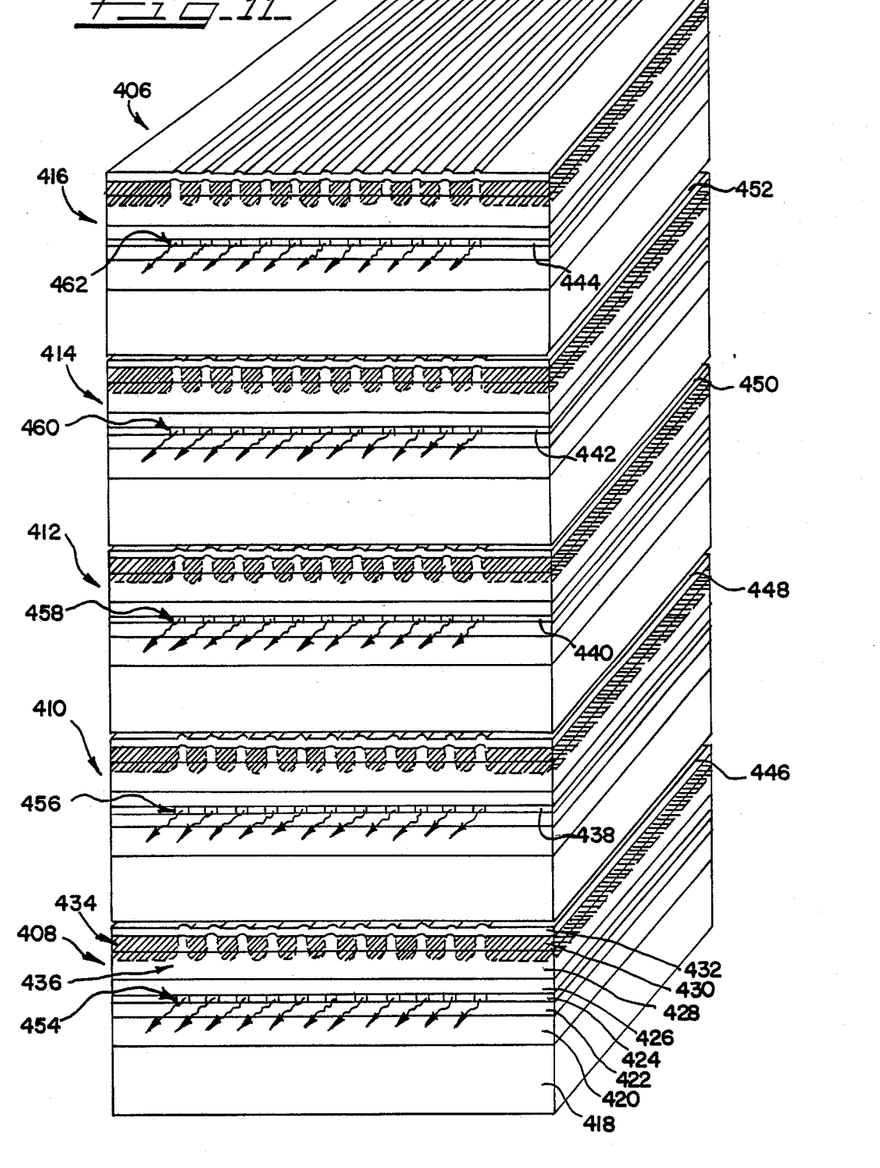
FIG. 11 of the drawings is a perspective view of another laser diode array suitable for use in the practice of this invention.

FIG. 11 illustrates an alternate laser diode array which is also suitable for use in the practice of the subject invention. It will be appreciated, that any number of laser devices each with any number of strips can be utilized in the practice of this invention. A hybrid laser diode array 406 is shown which includes a fifth laser device 408 at the bottom, a fourth laser device 410, a third laser device 412, a second laser device 414, and a first laser device 416 at the top. The fifth laser device 408 includes a substrate 418 and layers 420, 422, 424, fifth active layer 426, layer 428, 430, and 432 with a proton implant region 434, and a plurality of strips 436 having the same width. However, similarly, the fourth, third, second and first laser devices 410, 412, 414 and 416 include similar layers, except that each has a different active layer.

Under lasing conditions, the hybrid laser diode array 406 generates optical pumping radiation having a uniform intensity distributed over a broad bandwidth for pumping the absorption band of a lasant material. The intensity in the hybrid laser diode array 406 is greater than in the previous laser diode arrays, and can be easily maintained because of easy access to devices 408, 410, 412, 414 and 416 and efficiently mass produced. The fourth laser device 410 includes a fourth active layer 438, the third laser device 412 includes a third active layer 440, the second laser device 414 includes a second active layer 442, and first laser device 416 includes a first active layer 444.

Between each laser device 408, 410, 412, 414, and 416, are fourth space 446, third space 448, second space 450, and first space 452, respectively. Each active layer in each laser device includes a strip area 454, 456, 458, 460 and 462, adjacent to and below the plurality of strips 436 of each device. The hybrid laser device has a bandwidth of about 5 nm wide. Strip area 454 emits light from fifth active layer 424 ranging from about 808.8 nm to about 810.4 nm, preferably 809.6 nm, strip area 456 emits light ranging from about 808.0 nm to about 809.6 nm, preferably 808.8 nm from active layer 438, strip area 458 emits light ranging from about 807.2 nm to about 808.8 nm, preferably 808.0 nm from active layer 440, strip area 460 emits light ranging from about 806.4 nm to about 808.0 nm, preferably 807.2 nm from active layer 442, and strip area 462 emits light ranging from about 805.6 nm to 807.2nm, preferably 806.4 nm from active layer 444 under lasing conditions.

Devices 408, 410, 412, 414 and 416 can be temperature tuned in a manner similar in many respects to that disclosed with respect to laser device 200 in FIG. 6a, by tuning each such device at a different temperature, the aluminum concentration and doping can be varied in active layers 424, 438, 440, 442 and 444, in a manner similar in many respects to that discussed in connection with FIGS. 5, 7, or 9, the active layer thickness in each can be varied in a manner similar to that discussed in connection with FIGS. 8 and 10, the strip width can be varied as illustrated in FIG. 3, and/or each device can be pressure tuned, or any combination thereof.

Although the figures illustrate gain guided structures, those skilled in the art would recognize that other structures such as index guided structures can be utilized in the practice of this invention.

Although various embodiments of this invention have been shown and described, it is to be understood that various modifications and substitutions, as well as rearrangements and combinations of the preceding embodiments, can be made by those skilled in the art without departing from the novel spirit and scope of this invention.

We claim:

1. An optically pumped laser comprising
   (a) a laser diode array for generating optical pumping radiation, said pumping radiation having a bandwidth which is about 3 nm to about 15 nm wide and wherein the intensity of said pumping radiation is substantially uniformly distributed over said bandwidth, and
   (b) a lasant material with an absorption band for receiving radiation within said bandwidth of said laser diode array.

2. The optically pumped laser in accordance with claim 1 wherein said laser diode array includes a plurality of laser diodes, said laser diodes generating optical pumping radiation over a spectral band of substantially wider than said absorption band of said lasant material.

3. The optically pumped laser in accordance with claim 1 wherein said laser diode array comprises at least two laser diodes.

4. The optically pumped laser in accordance with claim 1 further comprising focusing means for focusing light from said laser diode array to said lasant material and a nonlinear optical member for modifying the frequency of said laser light from said lasant material.

5. The optically pumped laser in accordance with claim 1 wherein, said lasant material is a solid.

6. The optically pumped laser in accordance with claim 1 wherein said laser diode array comprises at least two laser diode arrays which generate optical pumping radiation over a spectral band substantially wider than said absorption band of said lasant material.

7. The optically pumped laser in accordance with claim 1 wherein said laser diode array comprises:
(a) at least one layer forming an active means, and
(b) means for forward biasing said active means, said forward biasing means includes a plurality of generally elongated strips, each of said strips having varying widths for confining current flow to a plurality of strip areas in said active means, said strip areas in said active means emitting pumping radiation having a bandwidth which is about 5 nm to about 15 nm wide.

8. The optically pumped laser in accordance with claim 1 wherein said laser diode array comprises:
(a) at least one layer forming an active means, said active means layer thickness varies in a substantially linear arrangement for varying the wavelength of the light emitted therefrom; and
(b) means for forward biasing said active means, said forward biasing means includes a plurality of elongated strips for confining current flow to a plurality of strips in said active means, said strip areas in the active means emitting pumping radiation having a bandwidth which is about 3 nm to about 12 nm wide.

9. The optically pumped laser in accordance with claim 1 wherein said laser diode array comprises:
(a) at least one layer forming an active means, said active means comprises the formula $Al_{zx}Ga_{1-z}As$ and wherein the value of z in said formula is less than about 0.15; and
(b) means for forward biasing said active means, said forward biasing means includes a plurality of elongated strips for confining current flow to said active means.

10. The optically pumped laser in accordance with claim 1 wherein said laser diode array comprises: (a) at least one layer forming an active means, (b) means for forward biasing said active means, said forward biasing means includes a plurality of generally elongated strips for confining current flow to a plurality of strips in said active means, and (c) temperature gradient means for applying a different temperature to each of said strip areas.

11. The optically pumped laser in accordance with claim 1 wherein said laser diode array comprises a plurality of active layers wherein each of said active layers produces pumping radiation within said bandwidth, said bandwidth ranging from about 3 nm to about 12 nm wide.

12. The optically pumped laser in accordance with claim 1 wherein said laser diode array includes a plurality of layered active means, each of said active layers comprises the formula $Al_zGa_{1-z}As$, wherein each of said active means has a value of z differing from that of any adjacent active layer by about 0.001, and wherein the value of z in said formula is less than about 0.10.

13. The optically pumped laser in accordance with claim 7 wherein each of said strip areas of said active means emits pumping radiation different from that of each adjacent strip area by about 1 nm.

14. The optically pumped laser in accordance with claim 8 wherein the cross section of said active layer perpendicular to the direction of light emission is substantially wedge shaped.

15. The optically pumped laser in accordance with claim 9 wherein each of said strip areas of said active means has a value of z different from that of any adjacent strip area by about 0.001, and wherein the value of z ranges from about 0.10 to about 0.05.

16. The optically pumped laser in accordance with claim 9 wherein the value of z in said formula is constant at about 0.07, said active means comprises the combination of AlGaAs and a dopant, said dopant concentration in each strip area of said active means is less than about $40 \times 10^{18}/cm^3$.

17. The optically pumped laser in accordance with claim 10 wherein each of said strip areas of said active means has a temperature applied thereto by said temperature gradient means differing from that of any adjacent strip area by about 3° C., said temperature gradient ranging from about 8° C. to about 36° C.

18. The optically pumped laser in accordance with claim 11 wherein the thickness of each of said active layers differs from that of any adjacent active layer, and wherein said thicknesses range from about 40Å to about 100Å.

19. The optically pumped laser in accordance with claim 12 wherein the value of z is constant at about 0.07 and each of said active layers comprises AlGaAs and a dopant, said dopant concentration in each of said active layers differs from that of any adjacent active layer, said dopant concentration ranging from about $3 \times 10^{18}/cm^3$ to about $8 \times 10^{18}/cm^3$.

20. The optically pumped laser in accordance with claim 14 wherein said bandwidth of said light emitted from said active means ranges from about 5 nm to about 12 nm wide.

21. The optically pumped laser in accordance with claim 14 wherein said active means layer thickness ranges from about 20Å to about 200Å.

22. The optically pumped laser in accordance with claim 14 wherein said active means layer thickness ranges from about 50Å to about 70Å.

23. The optically pumped laser in accordance with claim 14 wherein each of said strip areas of said active means has a thickness different from that of any adjacent strip area by about 2Å.

24. The optically pumped laser in accordance with claim 16 wherein each of said strip areas of said active means has a different dopant concentration from that of any adjacent strip area by about $0.3 \times 10^{18}/cm^3$, said concentration in said active means ranging from about $4 \times 10^{18}/cm^3$ to about $7 \times 10^{18} cm^3$.

25. The optically pumped laser in accordance with claim 16 wherein said dopant is any one of the group consisting of n-type dopants and p-type dopants, or combinations thereof.

26. The optically pumped laser in accordance with claim 25 wherein said dopant is a p-type dopant selected from the group consisting of magnesium, zinc, cadmium, beryllium, carbon, silicon, germanium, and tin or combinations thereof.

27. The optically pumped laser in accordance with claim 25 wherein said dopant is an n-type dopant selected from the group consisting of tellurium, selenium, sulfur, silicon, germanium, tin and carbon or combinations thereof.

* * * * *